United States Patent
Horikawa et al.

(10) Patent No.: US 8,787,028 B2
(45) Date of Patent: Jul. 22, 2014

(54) TERMINAL STRUCTURE, PRINTED CIRCUIT BOARD, MODULE BOARD, ELECTRONIC DEVICE, AND METHOD FOR MANUFACTURING TERMINAL STRUCTURE

(71) Applicant: TDK Corporation, Tokyo (JP)

(72) Inventors: Yuhei Horikawa, Tokyo (JP); Shin Fujita, Tokyo (JP); Kenichi Yoshida, Tokyo (JP); Hisayuki Abe, Tokyo (JP); Makoto Orikasa, Tokyo (JP); Hideyuki Seike, Tokyo (JP)

(73) Assignee: TDK Corporation, Tokyo (JP)

( * ) Notice: Subject to any disclaimer, the term of this patent is extended or adjusted under 35 U.S.C. 154(b) by 93 days.

(21) Appl. No.: 13/677,432

(22) Filed: Nov. 15, 2012

(65) Prior Publication Data
US 2013/0135834 A1 May 30, 2013

(30) Foreign Application Priority Data

Nov. 30, 2011 (JP) .................................. 2011-262041
Nov. 14, 2012 (JP) .................................. 2012-250621

(51) Int. Cl.
*H05K 7/00* (2006.01)
*H05K 1/02* (2006.01)
*H01R 43/02* (2006.01)

(52) U.S. Cl.
USPC ........... 361/767; 361/771; 174/259; 439/887; 29/874

(58) Field of Classification Search
USPC .......... 174/256–259, 260, 261; 361/760, 767, 361/768, 771, 779, 782, 783; 439/886, 887; 29/874, 877–879
See application file for complete search history.

(56) References Cited

U.S. PATENT DOCUMENTS

| 5,329,423 | A * | 7/1994 | Scholz ......................... 361/760 |
| 6,807,734 | B2 * | 10/2004 | Eldridge et al. ................ 29/874 |
| 8,191,246 | B1 * | 6/2012 | Luo ................................ 29/842 |
| 2002/0151104 | A1 * | 10/2002 | Sahara et al. ................. 438/117 |
| 2003/0047351 | A1 * | 3/2003 | Satsu et al. .................... 174/258 |
| 2005/0023033 | A1 * | 2/2005 | Saiki et al. .................... 174/260 |
| 2009/0008128 | A1 * | 1/2009 | Hasebe et al. ................ 174/252 |
| 2012/0153501 | A1 * | 6/2012 | Murai et al. .................. 257/774 |

FOREIGN PATENT DOCUMENTS

| JP | A-03-028381 | 2/1991 |
| JP | A-09-008438 | 1/1997 |

* cited by examiner

*Primary Examiner* — Hoa C Nguyen
(74) *Attorney, Agent, or Firm* — Oliff PLC

(57) ABSTRACT

The electronic device includes a terminal structure and a printed circuit board including the terminal structure. The terminal structure includes a solder-joint conductor region placed on a wiring conductor, an intermediate layer contacting with the conductor region, and a solder region contacting with the intermediate layer. The intermediate layer includes an intermetallic compound including tin and at least one of copper and nickel as principal components. When the indentation elastic modulus of the conductor region is E1 and the indentation elastic modulus of the intermediate layer is E2, the ratio of E1 to E2 is equal to or more than 0.8 and equal to or less than 1.5.

11 Claims, 11 Drawing Sheets

TERMINAL STRUCTURE, PRINTED CIRCUIT BOARD, MODULE BOARD, ELECTRONIC DEVICE, AND METHOD FOR MANUFACTURING TERMINAL STRUCTURE

TECHNICAL FIELD

An aspect of the present invention relates to a terminal structure, a printed circuit board, a module board, an electronic device, and a method for manufacturing a terminal structure.

BACKGROUND

For electronic devices, a method in which they are manufactured by connecting a module board mounted with various kinds of electronic parts to a motherboard, etc., is widely known. Such a module board is typically connected to a motherboard by solder-joining a solder-joint conductor region placed on a wiring conductor on its surface and an electrode terminal of the motherboard, thereby allowing the electronic parts mounted on the module board to function.

Although copper and copper-based alloys, which have low electric resistance, are the main current of the wiring conductor of module boards, copper oxidizes in the air, decreasing solder connection property. As surface treatment for preventing the oxidization of wiring conductors, therefore, electroless gold plating after performing electroless nickel plating has been performed. In this method, however, it is known that the surface of nickel may be corroded along with the precipitation of gold, thereby decreasing solder connection property. A method for forming an electroless palladium plating film as a protective layer between an electroless nickel plating film and an electroless gold plating film (for example, Patent Document 1) and a method for forming an imidazole compound film directly on a wiring conductor (for example, Patent Document 2) have been performed.

Patent Document 1: Japanese Patent Application Laid-Open No. H09-8438.
Patent Document 2: Japanese Patent Application Laid-Open No. H03-28381.

SUMMARY

From the viewpoint of ensuring the reliability of an electronic device, it is required that the connection between a module board and a motherboard and the connection between an electronic part and the module board do not easily break. In particular, a module board mounted on an electronic device that is carried daily, such as a cellular phone, and terminals that are provided thereon are required to have durability against drop impact (drop strength).

To this end, the inventors of the present invention studied further in detail the drop strength of a conventional terminal structure, As a result, it has been found that when a module board, etc., is solder-joined to a motherboard to be mounted thereon using the conventional terminal structure, the connection easily breaks in the terminal structure against drop impact, even with excellent solder connection property.

Some aspects of the present invention have been achieved in view of the above-described circumstances, and provide a terminal structure, a printed circuit board, a module board, an electronic device, having sufficiently excellent drop strength against a drop impact applied to the connection surface of a board, and a method for manufacturing the terminal structure.

An aspect of the present invention provides a terminal structure including a solder-joint conductor region placed on a wiring conductor, an intermediate layer contacting with the conductor region, and a solder region contacting with the intermediate layer. The intermediate layer comprises an intermetallic compound including tin and at least one of copper and nickel as principal components, and when the indentation elastic modulus of the conductor region is $E1$ and the indentation elastic modulus of the intermediate layer is $E2$, $E1$ and $E2$ satisfy the following expression (1).

$$0.8 \leq E1/E2 \leq 1.5 \tag{1}$$

This aspect is based on the inventors' original finding that controlling the relationship between the indentation elastic moduli of the conductor region and the intermediate layer is effective to improve drop strength. A specific layer structure based on the finding prevents load from concentrating within the terminal structure when a drop impact is applied, leading to a terminal with sufficiently excellent drop strength.

The conductor region preferably is copper or a copper-based alloy. This facilitates favorable control on the indentation elastic moduli of the conductor region and the intermediate layer, thereby providing a terminal structure that can achieve excellent drop strength.

The conductor region also preferably is nickel or a nickel-based alloy. This facilitates favorable control on the indentation elastic moduli of the conductor region and the intermediate layer, thereby providing a terminal structure that can achieve excellent drop strength.

The indentation elastic modulus $E3$ of a solder region is preferably smaller than the indentation elastic modulus $E2$ of the intermediate layer. This facilitates absorption of a load caused by a drop impact in the solder region and interferes with concentration of a load on the intermediate layer, thereby providing a terminal structure that can achieve further excellent drop strength.

Another aspect of the present invention provides a printed circuit board including the terminal structure. Since the printed circuit board has the terminal structure having the above-mentioned feature, it can achieve excellent drop strength.

Yet another aspect of the present invention provides a module board including the printed circuit board. Since the module board has the printed circuit board having the above-mentioned feature, the break of electric connection can be sufficiently prevented even when a drop impact is applied.

Another aspect of the present invention provides an electronic device including at least one of the printed circuit board and the module board. Since the electronic device has the printed circuit board and module board having the above-mentioned feature, the break of electric connection can be sufficiently prevented even when a drop impact is applied.

Still another aspect of the present invention provides a method for manufacturing a terminal structure including: a step of preparing a terminal structure including a solder-joint conductor region placed on a wiring conductor, an intermediate layer contacting with the conductor region, and a solder region contacting with the intermediate layer; a step of measuring the indentation elastic modulus of the conductor region; a step of measuring the indentation elastic modulus of the intermediate layer; a step of judging whether the resistance to drop impact of the terminal structure is favorable based on the value of the indentation elastic modulus of the conductor region and the value of the indentation elastic modulus of the intermediate layer; and a step of producing a terminal structure under the same condition as the production condition of the terminal structure that has been judged to show favorable resistance to drop impact at the step of judging. Through the method for manufacturing a terminal structure, drop strength can be judged by a stable numerical indication, the property of the terminal structure, without being affected by external factors (such as voids and dust) that could occur during the formation process of the terminal structure and decrease drop strength, thereby obtaining high evaluation reliability. As a result, an electronic device having the terminal structure is provided with high reliability with respect to drop strength, and manufacturing cost can be reduced owing to the stabilization of evaluation and improvement in the reliability of performance.

In the present manufacturing method, the intermediate layer preferably comprises an intermetallic compound including tin and at least one of copper and nickel as principal components. This facilitates favorable control of the indentation elastic moduli of the conductor region and the intermediate layer, thereby allowing a terminal structure with excellent drop strength to be manufactured more easily.

A terminal structure that can achieve sufficiently excellent drop strength against a drop impact applied to the board and a manufacturing method thereof can be thus provided. The terminal structure leads to a printed circuit board, a module board, and an electronic device in which electric connection does not easily break even when a drop impact is applied.

DESCRIPTION OF EMBODIMENTS

Figure 1:
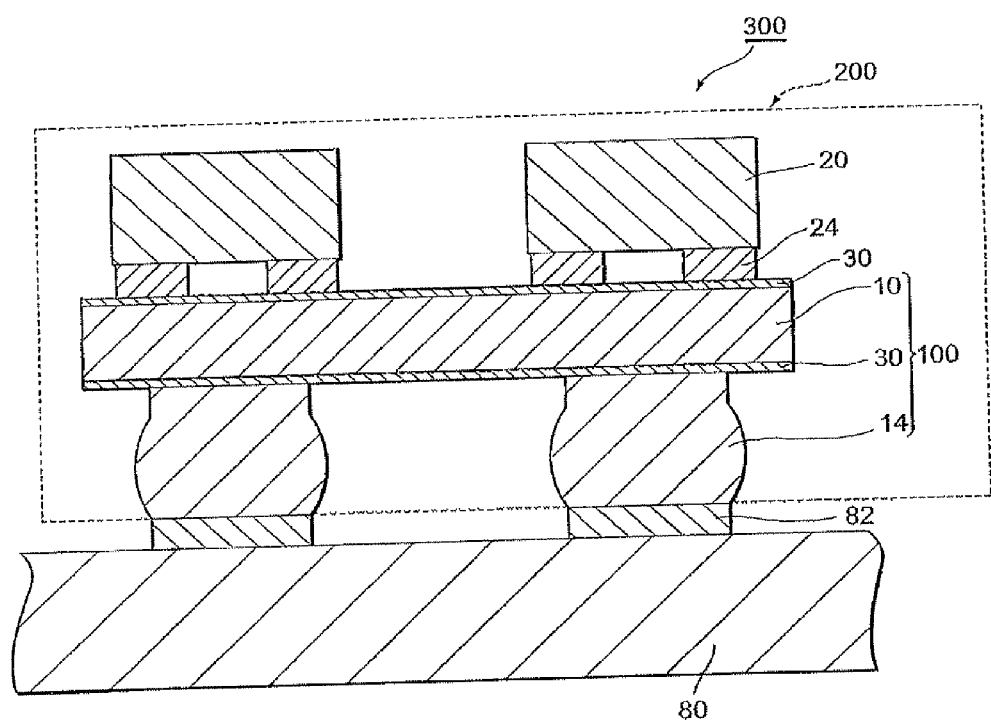
FIG. 1 is a sectional view schematically illustrating a preferred embodiment of an electronic device.

Preferred embodiments will be described below with reference to the drawings. In the drawings, the same or equivalent elements will be provided with the same signs, and duplicated description will be omitted.

FIG. 1 is a sectional view schematically illustrating a preferred embodiment of an electronic device.

Electronic Device

An electronic device 300 includes a motherboard 80 and a module board 200 mounted on the motherboard 80. The module board 200 includes a printed circuit board 100 and an electronic component 20 that is connected to the printed circuit board 100 with a joint structure 24 interposed therebetween. The printed circuit board 100 includes a substrate 10, a wiring conductor 30, and a terminal structure 14. An electrode terminal 82 is provided on the motherboard 80, and the electrode terminal 82 and the wiring conductor 30 are connected with the terminal structure 14 interposed therebetween. Similarly, a terminal of the electronic component 20 and the wiring conductor 30, which is provided on the other surface of the printed circuit board 100 so as to face the terminal, are connected with the joint structure 24 interposed therebetween.

Figure 2:
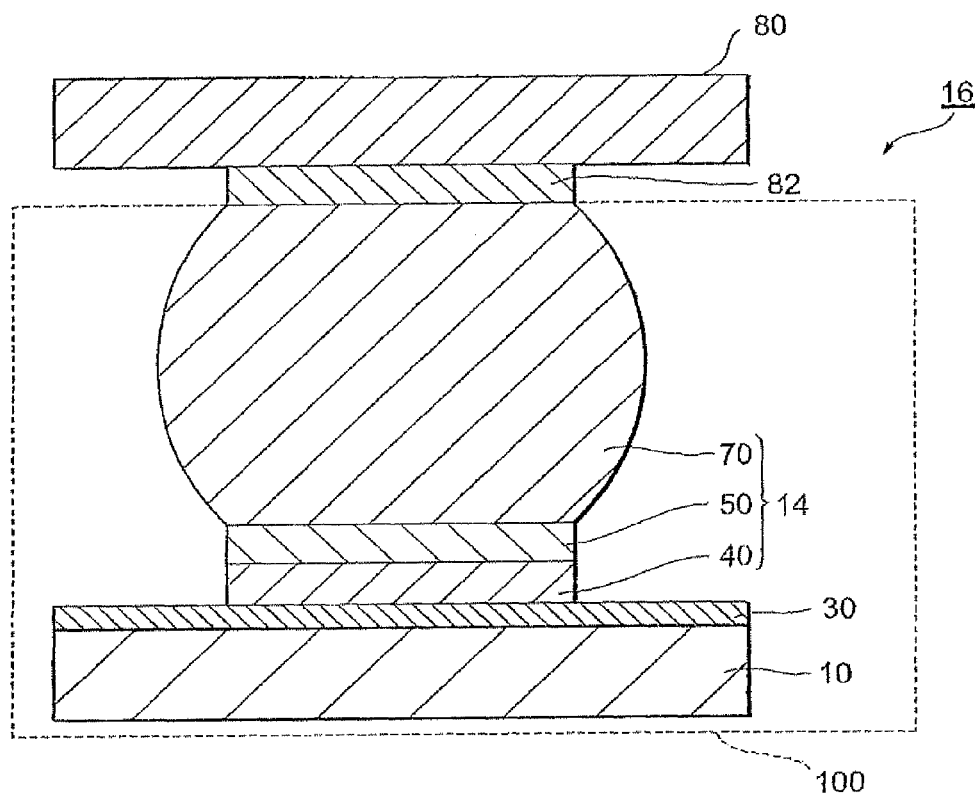
FIG. 2 is a sectional view schematically illustrating a preferred embodiment of a terminal structure.

FIG. 2 is a sectional view schematically illustrating a preferred embodiment of a terminal structure.

Terminal Structure

The motherboard 80 and a connection part 16 of the printed circuit board 100 are electrically connected by connecting the electrode terminal 82 the wiring conductor 30 through the terminal structure 14, the electrode terminal 82 being formed on one surface of the motherboard 80, and the wiring conductor 30 being formed on one surface of the substrate 10 so as to face the electrode terminal 82. The terminal structure 14 includes a conductor region 40 placed on the wiring conductor 30, an intermediate layer 50 contacting with the conductor region 40, and a solder region 70 contacting with the intermediate layer 50. If the conductor region 40 is defined as a solder joint area on the wiring conductor 30, any partial area of the wiring conductor 30 may be the conductor region 40, and it may be formed on the wiring conductor 30 through means such as plating.

The conductor region 40 is (includes as constitutive component) preferably copper or a copper-based alloy. Although a method for forming the conductor region 40 is not limited in particular, for example, plating, foil pasting, sputtering, etc. can be selected as appropriate in order to favorably control the indentation elastic moduli of the conductor region 40 and the intermediate layer 50 formed on the conductor region 40 through solder joint.

The conductor region 40 also is (includes as constitutive component) preferably includes nickel or a nickel-based alloy. Although a method for forming the conductor region 40 is not limited in particular, for example, plating, sputtering, etc. can be selected as appropriate in order to favorably control the indentation elastic moduli of the conductor region 40 and the intermediate layer 50 formed on the conductor region 40 through solder joint.

The intermediate layer 50 is formed at the time of solder joint and comprises an intermetallic compound including tin (Sn) and at least one of copper (Cu) and nickel (Ni) as principal components. The composition of the intermediate layer 50 changes in accordance with the composition of the conductor region 40, and a solder composition and a reflow condition for forming the solder region 70 and is preferably $Cu_6Sn_5$, $Ni_3Sn_4$, or a mixed phase thereof. This allows the indentation elastic moduli of the intermediate layer 50 and the conductor region 40 to be favorably controlled to achieve favorable drop strength.

With respect to the atomic ratio constituting the intermediate layer 50, a case in which the sum of tin and at least one of copper and nickel exceeds 50% is regarded as "tin and at least one of copper and nickel are contained as principal components."

The solder region 70 preferably includes tin-silver-copper (Sn—Ag—Cu)-based, tin-silver (Sn—Ag)-based, tin-copper (Sn—Cu)-based, or tin-bismuth (Sn—Bi)-based solder, which are lead free, as a principal component. This can achieve the terminal structure 14 with concern over environmental pollution sufficiently reduced.

The compositions of the conductor region 40, the intermediate layer 50, and the solder region 70 constituting the terminal structure 14 can be measured by, for example, analyzing a section of the terminal structure 14 using a commercially available energy dispersive spectrometer (EDS).

The indentation elastic moduli of the conductor region 40, the intermediate layer 50, and the solder region 70 constituting the terminal structure 14 can be measured using, for example, a commercially available nano-indentation tester, or more specifically, an ultra-micro indentation hardness tester manufactured by Elionix Inc. (the product name: ENT-1100a).

Figure 3:
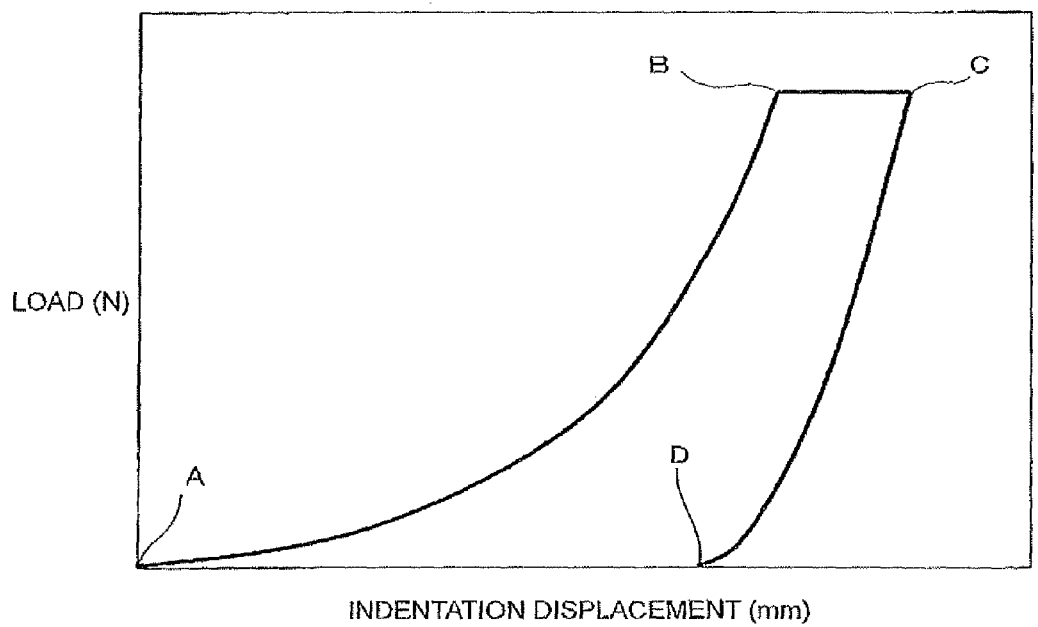
FIG. 3 is a diagram illustrating the relationship between the indentation displacement of a constitutive layer included in a terminal structure as a preferred embodiment and load.

FIG. 3 is a graph illustrating the relationship between the indentation displacement of an arbitrary layer constituting the terminal structure of the present embodiment and load measured with the measuring apparatus above. With reference to FIG. 3, a method for determining the indentation elastic moduli of the conductor region 40, the intermediate layer 50, and the solder region 70 constituting the terminal structure 14 shown in FIG. 2 will be described. First, the printed circuit board 100 including the terminal structure 14 is subjected as appropriate to grinding, cutting, polishing, etc., to obtain a section of the terminal structure 14.

A Berkovich indenter is then pressed against the cross sections of the conductor region 40, the intermediate layer 50, and the solder region 70 constituting the terminal structure 14 with a minimum load ($F_{min}$) (Point A in FIG. 3). The load is then increased to a maximum load ($F_{max}$) over a predetermined time (t1) to reach Point B in FIG. 3. The maximum load is maintained over a predetermined time (t2) to reach Point C in FIG. 3. The load is then decreased from the maximum load to the minimum load over a predetermined time (t3) to reach Point D in FIG. 3. Using the slope [N/mm] at Point C on a curve C-D, the indentation elastic moduli ($E_{1T}$ [GPa]) of the conductor region 40, the intermediate layer 50, and the solder region 70 constituting the terminal structure 14 can be determined by the following formula.

$$E_{1T} = (1 - V_s^2)/(2000/\sqrt{\pi} \times 4.888\ h/S(1 - V_i^2)/E_i) \qquad (2)$$

In the formula, S represents the slope [N/mm] at Point C on the curve C-D. $V_s$ represents the Poisson ratio of the sample, $V_i$ the Poisson ratio of the indenter, and $E_i$ the indentation elastic modulus [GPa] of the indenter. "4.888 h" is the square root [mm] of a projected contact area determined from an indentation displacement h [mm] in the Berkovich indenter. The indentation direction is a direction perpendicular to the section illustrated in FIG. 2.

In the measurement illustrated in FIG. 3, t1 and t3 are, for example, 5 seconds, while t2 is, for example, 1 second. $F_{max}$ and $F_{min}$ are, for example, 25 mN and 0.05 mN, respectively. To accurately measure the indentation elastic moduli of the conductor region 40, the intermediate layer 50, and the solder region 70, t1, t2, t3, $F_{max}$, and $F_{min}$ are preferably adjusted as appropriate so that the indenter will not extend off the conductor region 40, the intermediate layer 50, and the solder region 70.

The ratio of the indentation elastic modulus E1 of the conductor region 40 to the indentation elastic modulus E2 of the intermediate layer 50 (E1/E2) is, from the viewpoint of obtaining favorable resistance to drop, from 0.8 to 1.5 and preferably from 1.0 to 1.3.

The terminal structure 14 and the printed circuit board 100 including the terminal structure of the present embodiment can achieve sufficiently excellent drop strength. In the module board 200 and the electronic device 300 including the printed circuit board 100 that includes the terminal structure above, the electric connection does not easily break, resulting in having sufficiently excellent drop strength. Although it is not completely clear why such an effect is obtained, the inventors infer as follows.

In a drop impact, a strong load is applied in an extremely short time duration, and is removed. It is therefore known that elastic deformation predominates in an object that has received an impact if the load by the impact is equal to or less than a yield stress. In this situation, the load propagates as a wave through the object to which the impact has been applied. Since a wave has a property that is reflected off a boundary between substances having different ease of wave propagation, the load by the drop impact concentrates on the boundary between substances having different ease of elastic deformation.

In the terminal structure 14 of the present embodiment, the ratio E1/E2 with respect to the indentation elastic modulus E1 of the conductor region 40 and the indentation elastic modulus E2 of the intermediate layer 50 is from 0.8 to 1.5, that is, the difference in ease of elastic deformation between the conductor region 40 and the intermediate layer 50 is small. This can suppress load concentration due to a load by a drop impact being reflected off the boundary between the conductor region 40 and the intermediate layer 50, resulting in improvement in drop strength.

In contrast, when the difference between the indentation elastic modulus E1 of the conductor region 40 and the indentation elastic modulus E2 of the intermediate layer 50 becomes too large, a load by an impact concentrates on the boundary between the conductor region 40 and the intermediate layer 50, resulting in reduction in drop strength.

In the terminal structure 14 of the present embodiment, furthermore, the ratio E1/E2 is preferably from 1.0 to 1.3. The ratio E1/E2 within such a range allows the greater part of the drop impact to propagate to the conductor region 40. Since the conductor region 40 does not easily break even when a drop impact is applied, drop strength is further improved.

In other words, the above-described matter is based on the inventors' original finding that controlling the relationship between the indentation elastic moduli of the conductor region 40 and the intermediate layer 50 is effective to improve drop strength. A specific layer structure based on the finding prevents load from concentrating within the terminal structure when a drop impact is applied, consequently providing a terminal with sufficiently excellent drop strength. However, a reason why the effect of the embodiment is obtained is not limited to the factor above.

The indentation elastic modulus E1 of the conductor region 40 is smaller for copper or a copper-based alloy and is larger for nickel or a nickel-based alloy. Even with the same composition, the indentation elastic moduli of the conductor region 40 and the intermediate layer 50 change by manufacturing method, such as plating and sputtering. The conductor region 40 is therefore selected as appropriate in accordance with the indentation elastic modulus of the intermediate layer 50, which will be described later. As one example, for nickel-phosphorous plating providing a nickel-based alloy, within a range of phosphorous concentration in nickel of from 1 to 16% by mass, the indentation elastic modulus tends to decrease as the phosphorous concentration increases.

The indentation elastic modulus E2 of the intermediate layer 50 changes depending on the composition of the conductor region 40, the composition of the solder region 70, the amount of heat added at the time of reflow, etc. As one example, in the terminal structure 14 including the conductor region 40 including copper and the intermediate layer 50 and the solder region 70 formed by printing solder with a composition of Sn-3Ag-0.5Cu on the conductor region 40 and performing heating and cooling by reflow, the indentation elastic modulus E2 of the intermediate layer 50 tends to increase as the amount of heat added at the time of reflow increases. The amount of heat added at the time of reflow is controlled depending on top temperature (the maximum value of temperature), solder melting time, heating speed, cooling speed, etc., at the time of reflow.

The indentation elastic modulus E3 of the solder region 70 is preferably smaller than the indentation elastic modulus E2 of the intermediate layer 50. Since the solder region 70 is easier to become deformed than the intermediate layer 50 when a drop impact is applied, it absorbs the impact. This prevents load from concentrating on the boundary between the intermediate layer 50 and the solder region 70, consequently improving drop strength.

The indentation elastic modulus E3 of the solder region 70 changes by the composition of solder used for forming the solder region 70. As one example, for Sn—Ag-based, lead-free solder, the indentation elastic modulus tends to increase as a Ag-adding amount increases.

Method for Manufacturing Terminal Structure

Next, among methods for manufacturing the terminal structure 14 included in the electronic device 300 of the present embodiment, an example in which the conductor region 40 includes a nickel-based alloy will be described below.

Formation of Terminal Structure when Conductor Region Includes Nickel or Nickel-Based Alloy The present manufacturing method includes a step of preparing substrate, a step of degreasing, a step of soft etching, a step of pre-dip, an activation step, a post-dip step, an electroless nickel plating step, an electroless palladium plating step, an electroless gold plating step, and a solder region formation step in order to form a terminal structure, a component mounting step in order to form a module board, a solder applying step in order to form an electronic device, a module board mounting step, and a solder reflow step.

Figure 4:
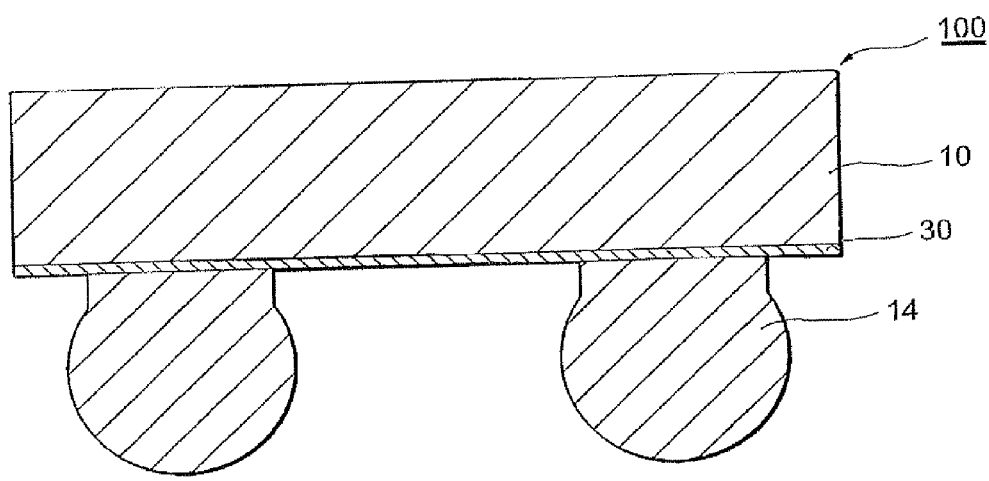
FIG. 4 is a sectional view schematically illustrating a preferred embodiment of a printed circuit board.

FIG. 4 is a sectional view schematically illustrating the printed circuit board 100 including the terminal structure 14 obtained by the method described below.

(Formation of Printed Circuit Board Including Terminal Structure)

First, steps for forming the terminal structure on the substrate 10 will be described.

A commercially available substrate 10 including copper as the wiring conductor or a substrate 10 manufactured by a publicly known method is prepared. The substrate 10 may incorporate electronic components or ICs therein. A plating film is formed on the wiring conductor 30 of the substrate 10 by the following steps.

The degreasing step can be performed using a commercially available degreasing solution. To degrease the surface of the wiring conductor 30 of the substrate 10, it is preferable to immerse the wiring conductor 30 into the degreasing solution and then take it out to wash with water.

The soft etching step can be performed using a commercially available soft etching solution. To remove an oxide film present on the surface of the wiring conductor 30 of the substrate 10, it is preferable to immerse the wiring conductor 30 into the soft etching solution and then take it out to wash with water.

The pre-dip step can use the same activation processing solution as used in the following activation step. This pre-dip step can prevent the concentration of the active component at the activation processing solution at the activation step from fluctuating.

The activation step can be performed using a commercially available activation processing solution. The post-dip step can be also performed using a commercially available post-dip solution. The post-dip step can remove palladium component, etc., that has attached to a nonconductor part in the preceding step.

In the electroless nickel plating step, the wiring conductor 30 is immersed into a commercially available electroless nickel plating solution. The temperature of the electroless nickel plating solution is from 50 to 95° C. and preferably from 60 to 90° C. The pH of the electroless nickel plating solution is preferably adjusted from 4.0 to 6.0 using, for example, dilute sulfuric acid and sodium hydroxide.

In the electroless palladium plating step, an electroless palladium plating is formed on the electroless nickel plating film using a commercially available electroless palladium plating solution.

In the electroless gold plating step, a gold plating film is formed using a commercially available electroless gold plating solution.

Only one of the electroless palladium plating step and the electroless gold plating step may be performed.

In the solder region formation step, solder balls are attached to the surface of the plating film opposite to the wiring conductor 30 side using a commercially available flux. Thereafter, the substrate 10, the plating film, and the solder balls are heated at a temperature of from 240 to 260° C. for from 10 to 300 seconds, thereby causing mutual diffusion of atoms, forming the intermediate layer 50 and the solder region 70 on the conductor region 40 including a nickel-based alloy, and obtaining the printed circuit board 100 having the terminal structure 14. The palladium plating layer and gold plating layer formed by electroless plating diffuse into at least one of the intermediate layer 50 and the solder region 70 to the extent that they cannot be substantially recognized as a layer, and merge therewith.

The substrate 10 of the printed circuit board 100 above may be a resin substrate, such as epoxy resin, or may be a glass ceramic substrate. The resin substrate can be formed by connecting electronic components, such as filters and capacitors, to a commercially available printed circuit board as needed and performing copper through-hole plating. The glass ceramic substrate can be manufactured as follows. First, using a dielectric paste including glass powder, binder, solvent, plasticizer, dispersing agent, etc., a green sheet is formed by the doctor blade method or other methods.

A conductor paste including an electrically conductive material that includes various electrically conductive metals and alloys, such as silver, a silver-palladium alloy, copper, and nickel, and an organic vehicle is applied to the green sheet, and via holes are formed, to form an electrically conductive pattern with a predetermined shape. Thereafter, a plurality of green sheets on with electrically conductive patterns are formed as needed are stacked, pressed, and burned to obtain a multilayer glass ceramic substrate. A single-layer glass ceramic substrate can be obtained through burning without performing the stacking.

(Formation of Module Board)

Next, a method for forming the module board 200 using the printed circuit board 100 will be described.

Figure 5:
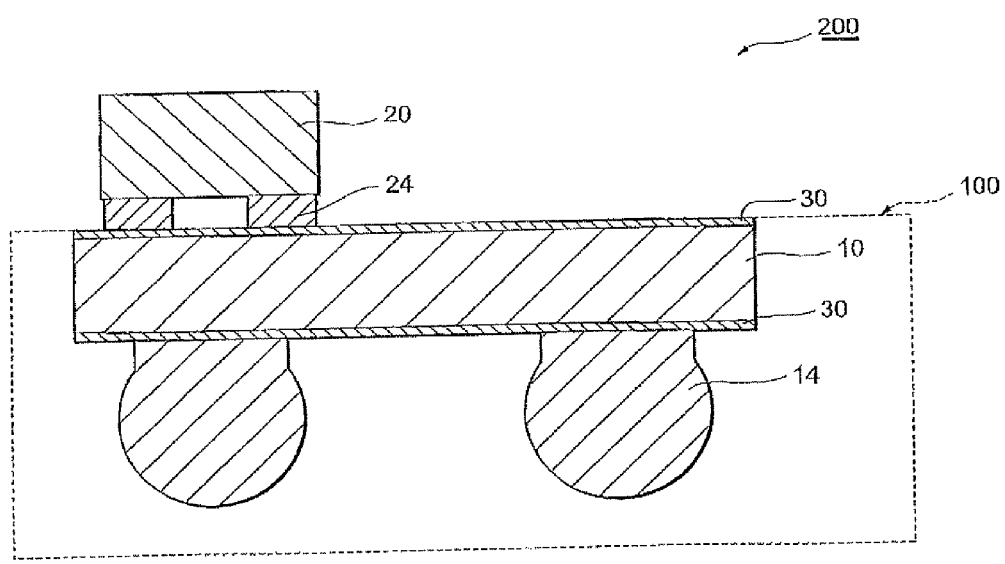
FIG. 5 is a sectional view schematically illustrating a preferred embodiment of a module board.

FIG. 5 is a sectional view schematically illustrating the module board 200 including the terminal structure 14 obtained by the method described below.

In a module board formation step, the electronic component 20 is mounted on the surface of the printed circuit board 100 opposite to the surface including the terminal structure 14 through the joint structure 24. This provides the module board 200 including the terminal structure 14. The electronic component 20 includes various electronic components such as filters, ICs, and capacitors. A method for connecting the electronic component 20 to the electrode terminal of the printed circuit board 100 includes methods by solder joint, electrically conductive adhesive joint, wire bonding joint, flip-chip joint, etc.

When solder joint is used as a method for connecting the electronic component 20 and the electrode terminal of the printed circuit board 100, the joint structure 24 may be similar to the terminal structure 14.

When the module board is produced, the terminal structure 14 may be formed to provide the module board 200 after mounting the electronic component 20 on the substrate 10. Even when this method is used, it is regarded that the obtained module board 200 includes the printed circuit board 100.

(Formation of Electronic Device)

Next, a method for forming the electronic device 300 using the module board 200 will be described.

FIG. 1 is a sectional view schematically illustrating the electronic device 300 including the terminal structure 14 obtained by the method described below.

In the step of forming the electronic device 300, first, the motherboard 80 having the electrode terminal 82 is prepared, Cream solder is applied to the surface of the electrode terminal 82. With respect to the electrode terminal, the module board 200 having the terminal structure 14 is placed so that the solder region 70 and the electrode terminal 82 come into contact with each other through the cream solder, and then is put into a reflow furnace in this state to be heated and cooled. The cream solder and solder region 70 melt through heating and then are solidified through cooling, which allows the terminal structure 14 and the electrode terminal 82 to be connected, thereby the electronic device 300 is formed. The printed circuit board 100 may be used in place of the module board 200.

The cream solder may be applied by printing using a metal mask. The kinds of the cream solder preferably include Sn—Ag—Cu-based, Sn—Cu-based, or Sn—Bi-based solder.

In the electronic device 300 of the present embodiment, drop strength is thus improved by providing a structure in which a drop impact does not concentrate on the terminal structure in the connection part between at least one of the module board 200 and the printed circuit board 100 and the motherboard 80. The electronic device having such a connection part therefore has extremely high drop strength and can be used favorably for in particular cellular phones, portable personal computers, portable game machines, etc.

Formation of Terminal Structure when Conductor Region Includes Copper or Copper-Based Alloy Next, an example when the conductor region 40 includes copper will be described below.

The present manufacturing method includes a substrate preparation step, a degreasing step, a soft etching step, an acid washing step, a water-soluble preflux step, and a solder region formation step in order to form a terminal structure; a component mounting step in order to form a module board; and a solder applying step, a module board mounting step, and a solder reflow step in order to form an electronic device. The present method has the same component mounting step and the following steps in order to form a module board as those of the method above in which a nickel-based alloy is used for the conductor region. Thus, the same part will be omitted in the following description.

FIG. 4 is a sectional view schematically illustrating the printed circuit board 100 including the terminal structure 14 obtained by the method described below.

First, a substrate 10 including copper as a wiring conductor 30 or a substrate 10 formed by a publicly known method is prepared. The substrate 10 may incorporate electronic components or ICs therein. A conductor region 40 is formed on the wiring conductor 30 on the substrate 10 by the following steps.

The degreasing step can be performed using a commercially available degreasing solution. To degrease the surface of the wiring conductor 30 of the substrate 10, it is preferable to immerse the wiring conductor 30 into the degreasing agent and then take it out to wash with water.

The soft etching step can be performed using a commercially available soft etching solution. To remove an oxide film present on the surface of the wiring conductor 30 of the substrate 10, it is preferable to immerse the wiring conductor 30 into the soft etching solution and then take it out to wash with water.

The acid washing step can be performed using commercially available sulfuric acid. To remove an oxide film remaining on the surface of the wiring conductor 30 of the substrate 10 even after the soft etching step, it is preferable to the wiring conductor 30 into an acid washing solution and then take it out to wash with water.

In the water-soluble preflux step, the wiring conductor 30 is immersed into a commercially available water-soluble preflux solution. The temperature of the water-soluble preflux solution is from 20 to 60° C. and preferably from 30 to 50° C. This enables formation of the conductor region 40 that has been subjected to preflux processing on the wiring conductor 30.

In the solder region formation step, solder balls are attached to the surface of the conductor region 40 that has been subjected to preflux processing, using commercially available flux. Thereafter, the substrate 10, a preflux film, and the solder balls are heated at a temperature of from 240 to 260° C. for from 10 to 60 seconds, thereby causing mutual diffusion of atoms, forming the intermediate layer 50 and the solder region 70 on the conductor region 40 including copper, and obtaining the printed circuit board 100 having the terminal structure 14.

A plating film having a small thickness to the extent that the layer cannot be substantially recognized after diffusing into at least one of the intermediate layer 50 and the solder region 70 may be formed through a pre-dip step, an activation step, a post-dip step, an electroless nickel plating step, an electroless palladium plating step, and an electroless gold plating step, which are similar to the case in which the conductor region includes nickel or a nickel-based alloy, in place of the acid washing step and the water-soluble preflux step. This can favorably change the indentation elastic modulus of the intermediate layer 50, thereby forming the terminal structure 14 with excellent drop strength. Only one or two steps out of the electroless nickel plating step, electroless palladium plating step, and electroless gold plating step may be performed.

Method for Manufacturing Terminal Structure Based on Value of Indentation Elastic Modulus Next, a favorable method for manufacturing the terminal structure 14 having the structure above will be described.

The method for manufacturing the terminal structure 14 includes a method for manufacturing the terminal structure 14 that includes: a step of preparing the terminal structure 14 having the solder-joint conductor region 40 placed on the wiring conductor 30, the intermediate layer 50 contacting with the conductor region 40, and the solder region 70 contacting with the intermediate layer 50; a step of measuring the indentation elastic modulus of the conductor region 40; a step of measuring the indentation elastic modulus of the intermediate layer 50; a step of judging whether the resistance to drop impact of the terminal structure 14 is favorable based on the value of the indentation elastic modulus of the conductor region 40 and the value of the indentation elastic modulus of the intermediate layer 50 (an indentation elastic modulus judging step); and a step of producing the terminal structure 14 under the same condition as the production condition of the terminal structure 14 that has been judged to show favorable resistance to drop impact at the step of judging (a terminal structure production step).

Since the manufacturing method above is performed similarly to the method above for the step of preparing the terminal structure and the step of measuring the indentation elastic modulus, the indentation elastic modulus judging step and the terminal structure production step will be described.

In the indentation elastic modulus judging step, it is judged whether the ratio in the terminal structure of the indentation elastic modulus E1 of the conductor region to the indentation modulus E2 of the intermediate layer (E1/E2) is favorable. For example, it is judged to be favorable when the ratio E1/E2 is from 0.8 to 1.5, judged to be more favorable when the ratio E1/E2 is from 1.0 to 1.3, and judged to be unfavorable when the ratio E1/E2 is out of that range.

In the terminal structure production step, the terminal structure 14 is produced under the same condition as the production condition of the terminal structure that has been judged to have favorable drop strength by the indentation modulus judging step. In the present manufacturing method, the intermediate layer 50 preferably comprises an intermetallic compound having at least one of copper and nickel as a principal component.

Although the favorable embodiment has been so far described, the present invention is not limited to the embodiment above at all. For example, although the embodiment has been described using the electronic device, the present terminal structure may be provided in a single-layer printed circuit board or a multilayer printed circuit board with no electronic device mounted.

EXAMPLES

More detailed description will be provided below using examples and comparative examples, but the present invention is not limited to the following examples.

Example 1

In Example 1, the following steps (A), (B), (C), (D), (E), (F), (G1), (G2), (G3), (H), and (I) are performed successively to produce a module board, and then the steps (J), (K), (L), and (M) are performed successively to produce an electronic device for evaluation.

(1) Production of Module Board (A) Substrate Preparation Step

First, an FR4-standard copper-clad laminate (thickness: 0.3 mm) was prepared. Through holes were formed in the copper-clad laminate using an NC drill, etching resist having a predetermined shape was formed, and unnecessary copper wiring was removed by etching, thereby forming a daisy-chain circuit pattern. Thereafter, copper through-hole plating was performed, and a part of the surface of the substrate is overcoated with solder resist, thereby forming a precursor substrate including the predetermined daisy-chain circuit pattern and solder ball connection terminals (Ø0.6 mm).

(B) Degreasing Step

The precursor substrate was immersed into a degreasing solution (manufactured by Okuno Chemical Industries Co., Ltd., the product name: Ace Clean 850) at 40° C. for 3 minutes, and taken out to be washed with water for 1 minute.

(C) Soft Etching Step

The substrate was immersed in to a soft etching solution (a mixture solution of 100 g/L of sodium persulfate and 10% sulfuric acid) at 30° C. for 1 minute, and taken out to be washed with water for 1 minute.

(D) Pre-Dip Step

The substrate was immersed into a pre-dip solution (manufactured by Okuno Chemical Industries Co., Ltd., the product name: NNP Accera B) at 25° C. for 30 seconds. This step was performed in order to prevent a reduction in the concentration of each component of a plating bath for use in the next step.

(E) Activation Step

The substrate was immersed into a plating activation solution (manufactured by Okuno Chemical Industries Co., Ltd., the product name: NNP Accera) at 35° C. for 5 minutes. It was then taken out from the plating activation solution and washed with water for 1 minute.

(F) Post-Dip Step

The substrate was immersed into a post-dip solution (manufactured by Okuno Chemical Industries Co., Ltd., the product name: NNP Post-Dip 401) at 25° C. for 2 minutes to remove a palladium component that has been attached to a nonconductor part of the substrate.

(G1) Electroless Nickel Plating Step

An electroless nickel plating bath (the bath type "a" indicated in Table 1) is adjusted to have a pH of 4.6 using an aqueous solution of sodium hydroxide. The substrate was immersed into the adjusted electroless nickel plating bath at 85° C. for 23 minutes to form an electroless plating nickel film with a film thickness of 3 μm on the solder ball connection terminals. The substrate was then taken out from the electroless nickel plating bath and washed with water for 1 minute. The phosphorous concentration was 11% by mass as a result of measurement of the phosphorous concentration within the electroless nickel plating film under an EDS.

(G2) Electroless Palladium Plating Step

The substrate was immersed into an electroless palladium plating bath indicated by the bath type "A" in Table 2 at 60° C. for 3 minutes to form an electroless plating palladium film with a film thickness of 0.1 μm on the electroless nickel plating film. The substrate was then taken out from the electroless palladium plating solution and washed with water for 1 minute. The phosphorous concentration was 0% by mass as a result of measurement of the phosphorous concentration within the electroless nickel plating film under an EDS.

(G3) Electroless Gold Plating Step

The substrate was immersed into an electroless gold plating bath indicated in Table 3 at 85° C. for 10 minutes to form an electroless gold plating film with a film thickness of 0.1 μm on the electroless palladium plating film. The substrate was then taken out from the electroless gold plating solution and washed with water for 1 minute.

(H) Solder region Formation Step

Sparkle Flux manufactured by Senju Metal Industry Co., Ltd. was printed on the solder ball connection terminals on one surface of the substrate to attach solder balls with Ø 0.8 mm manufactured by Senju Metal Industry Co., Ltd. (the product name: M705, the composition: 96.5 Sn-3.0Ag-0.5 Cu).

The substrate having terminals to which the sold balls were attached was put into a reflow furnace and heated to produce a printed circuit board having a predetermined terminal structure. The reflow condition included a solder melting time (time during which the temperature was 217° C. or more) of 30 seconds and a top temperature of 240° C.

(I) Component Mounting Step

A silicon dummy wafer with a thickness of 0.3 mm was affixed with adhesive to the surface of the substrate opposite to the surface on which the solder region was formed. Plastic molding was then performed to obtain a substrate with a total thickness of 2 mm. The module board thus obtained having a predetermined terminal structure was dicer cut into a 10 mm size.

(2) Production of Electronic Device for Evaluation (J) Production of Board for Evaluation Apart from the module board above, a 30-mm-long×120-mm-wide×0.8-mm-thick motherboard formed with a daisy-chain circuit pattern was prepared. The board was subjected to the following steps successively to produce an electronic device for evaluation.

(K) Solder Applying Step

Cream solder paste manufactured by Senju Metal Industry Co., Ltd. (the product name: M705-GRN360-MZ, the composition: 96.5Sn-3.0Ag-0.5Cu) was printed on the electrode terminals of the motherboard.

(L) Module Board Mounting Step

The module board was placed on the motherboard so that the electrode terminals of the motherboard would face the terminal structure of the dicer cut module board face.

(M) Solder Reflow Step

With the module board placed on the motherboard, they were put into a reflow furnace and heated to obtain an electronic device for evaluation having a predetermined terminal structure in the connection part between the motherboard and module board. This was designated as the electronic device of Example 1. The reflow condition included a solder melting time of 30 seconds and a top temperature of 230° C.

Figure 6:
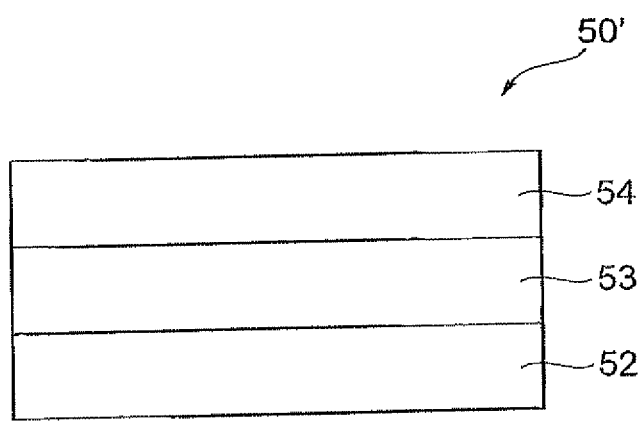
FIG. 6 is a diagram illustrating the structure of an intermediate layer before heating.

As described above, in Example 1, the following steps were performed successively.
(A) Substrate Preparation Step
(B) Degreasing Step
(C) Soft Etching Step
(D) Pre-Dip Step
(E) Activation Step
(F) Post-Dip Step
(G1) Electroless Nickel Plating Step
(G2) Electroless Palladium Plating Step
(G3) Electroless Gold Plating Step
(H) Solder region Formation Step
(I) Component Mounting Step
(J) Production of Board for Evaluation
(K) Solder Applying Step
(L) Module Board Mounting Step
(M) Solder Reflow Step FIG. 6 is a diagram illustrating the longitudinal sectional structure of the intermediate layer 50' before heating.

In Example 1, the plating formation steps (G1), (G2), and (G3) are performed successively. As illustrated in FIG. 6, therefore, a nickel plating layer 52, a palladium plating layer 53, and a gold plating layer 54 are formed on the wiring conductor successively, and at the heating in (H) Solder region Formation Step, palladium and gold, which have high diffusion coefficients, diffuse into the solder balls. Nickel in the nickel plating layer also diffuses into the solder balls and forms an alloy with the solder, thereby forming the intermediate layer 50 including an intermetallic compound having tin, copper, and nickel as principal components. However, since nickel diffuse to a less extent than palladium and gold, the nickel plating layer remains as the conductor region 40 on the solder ball connection terminals (the wiring conductor 30). This makes the conductor region 40 a nickel-phosphorous alloy.

Example 2

In Example 2, the following steps out of the steps in Example 1 were performed successively.
(A) Substrate Preparation Step
(B) Degreasing Step
(C) Soft Etching Step
(D) Pre-Dip Step
(E) Activation Step
(F) Post-Dip Step
(G1) Electroless Nickel Plating Step
(G2) Electroless Palladium Plating Step
(G3) Electroless Gold Plating Step
(H) Solder region Formation Step
(I) Component Mounting Step
(J) Production of Board for Evaluation
(K) Solder Applying Step
(L) Module Board Mounting Step
(M) Solder Reflow Step However, Example 2 is different from Example 1 in the solder melting time in the step (H). An electronic device was obtained as in Example 1 except that the solder melting time was 60 seconds in (H) Solder region Formation Step. This was designated as the electronic device of Example 2.

In Example 2, the plating formation steps (G1), (G2), and (G3) are performed successively. As illustrated in FIG. 6, therefore, the nickel plating layer 52, the palladium plating layer 53, and the gold plating layer 54 are formed on the wiring conductor 40 successively, and by the heating in (H) Solder region Formation Step, these layers merge as in Example 1, thereby forming the intermediate layer 50 including an intermetallic compound having tin, copper, and nickel as principal components and the conductor region 40 including a nickel-phosphorous alloy.

Example 3

Figure 7:
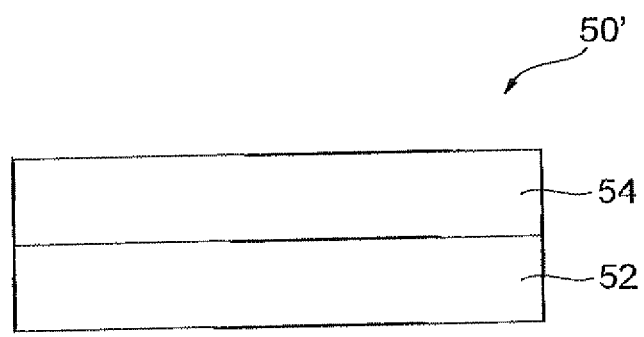
FIG. 7 is a diagram illustrating the structure of an intermediate layer before heating.

In Example 3, the following steps out of the steps in Example 1 were performed successively.
(A) Substrate Preparation Step
(B) Degreasing Step
(C) Soft Etching Step
(D) Pre-Dip Step
(E) Activation Step
(F) Post-Dip Step
(G1) Electroless Nickel Plating Step
(G3) Electroless Gold Plating Step
(H) Solder region Formation Step
(I) Component Mounting Step
(J) Production of Board for Evaluation
(K) Solder Applying Step
(L) Module Board Mounting Step
(M) Solder Reflow Step FIG. 7 is a diagram illustrating the longitudinal sectional structure of the intermediate layer 50' before heating.

In Example 3, an electronic device was obtained as in Example 1 except that (G2) Electroless Palladium Plating Step was omitted. This was designated as the electronic device of Example 3. In Example 3, the gold plating layer is formed on the nickel plating layer.

In Example 3, the plating formation steps (G1) and (G3) are performed successively. As illustrated in FIG. 7, therefore, the nickel plating layer 52 and the gold plating layer 54 are formed on the wiring conductor successively, and by the heating in (H) Solder region Formation Step, these layers partially merge, thereby, as in Example 1, forming the intermediate layer 50 including an intermetallic compound having tin, copper, and nickel as principal components and the conductor region 40 including a nickel-phosphorous alloy.

Example 4

In Example 4, the solder melting time was 60 seconds in (H) Solder region Formation Step in Example 3. The steps other than the step were performed as in Example 3 to obtain an electronic device for evaluation. This was designated as the electronic device of Example 4. Also in Example 4, the gold plating layer is formed on the nickel plating layer.

Also in Example 4, the intermediate layer 50 and the conductor region 40 as in Example 3 are formed.

Example 5

In Example 5, the film thickness was 0.1 µm in (G1) Electroless Nickel Plating Step in Example 3. The steps other than the step were performed as in Example 3 to obtain an electronic device for evaluation. This was designated as the electronic device of Example 5. Also in Example 5, the gold plating layer is formed on the nickel plating layer.

In Example 5, although the intermediate layer 50' as in Example 3 is formed, nickel perfectly diffuses into the solder balls, and the nickel plating layer 52 vanishes from the wiring conductor, since the thickness of the nickel plating layer 52 is small. Therefore, a region of the under layer being in contact with the nickel plating layer in the wiring conductor becomes the conductor region. The intermediate layer 50 after heating therefore includes an intermetallic compound having tin, copper, and nickel as primary components, and the conductor region 40 includes copper.

Example 6

In Example 6, the following steps out of the steps in Example 1 and steps (X1) and (X2) were performed successively in the following order.
(A) Substrate Preparation Step
(B) Degreasing Step
(C) Soft Etching Step
(X1) Acid Washing Step
(X2) Water-Soluble Preflux Treatment Step
(H) Solder region Formation Step
(I) Component Mounting Step
(J) Production of Board for Evaluation
(K) Solder Applying Step
(L) Module Board Mounting Step
(M) Solder Reflow Step In Example 6, first, (A) Substrate Preparation Step, (B) Degreasing Step, and (C) Soft Etching Step were performed as in Example 1. In Example 6, the steps (D), (E), and (F) in Example 1 were omitted, and (X1) Acid washing Step and (X2) Water-Soluble Preflux Treatment Step were added in place thereof. These steps are as follows.

(X1) Acid Washing Step

The substrate above was immersed into an acid washing solution (5% water solution of sulfuric acid) at 30° C. for 1 minute, and taken out to be washed with water for 1 minute.

(X2) Water-Soluble Preflux Treatment Step

The substrate was immersed into a water-soluble preflux solution (manufactured by Shikoku Chemicals Corporation, the product name: Tough Ace F2) at 40° C. for 60 seconds, and taken out to be washed with water for 1 minute.

After the step (X2), (H) Solder region Formation Step, (I) Component Mounting Step, (J) Production of Board for Evaluation. (K) Solder Applying Step, (L) Module Board Mounting Step, and (M) Solder Reflow Step were performed by the same method as in Example 1 to obtain an electronic device for evaluation. This was designated as the electronic device of Example 6.

In Example 6, the plating formation steps (G1), (G2), and (G3) in Example 1 are not performed. A partial area of the wiring conductor 30 that is provided for solder joint therefore makes the conductor region 40, which includes copper. The intermediate layer 50 is formed through the diffusion of copper and tin and includes copper and tin as primary components.

Example 7

An electronic device for evaluation was obtained as in Example 6 except that the solder melting time was 60 seconds in (H) Solder region Formation Step. This was designated as the electronic device of Example 7.

Example 8

Example 8 is different from Example 6 only in the steps (A) and (B), and the other steps are the same as Example 6.

In Example 8, after forming through holes in the substrate in (A) Substrate Preparation Step, a photoresist with a predetermined shape was formed in order for plating not to be deposited on unnecessary parts, and copper plating is performed on the through-hole part and the substrate surface, thereby forming a daisy-chain circuit pattern with a predetermined shape, and then, part of the surface of the substrate was overcoated with solder resist to form solder ball connection terminals (Ø0.6 mm).

In Example 8, an electronic device for evaluation was obtained as in Example 6 except that the solder melting time was 10 seconds, and the top temperature was 250° C. in (H) Solder region Formation Step. This was designated as electronic device of Example 8. Example 8 is different from Example 6 in that the base conductor region includes copper plating.

Example 9

Example 9 is different from Example 8 only in the step (H), and the other steps are the same as Example 8. In Example 9, in other words, an electronic device for evaluation was obtained as in Example 8 except that the solder melting time was 20 seconds in (H) Solder region Formation Step. This was designated as the electronic device of Example 9.

Example 10

In Example 10, an electronic device for evaluation was obtained as in Example 1 except that (G1) Electroless Nickel Plating Step in Example 1 was omitted. This was designated as the electronic device of Example 10.

Figure 8:
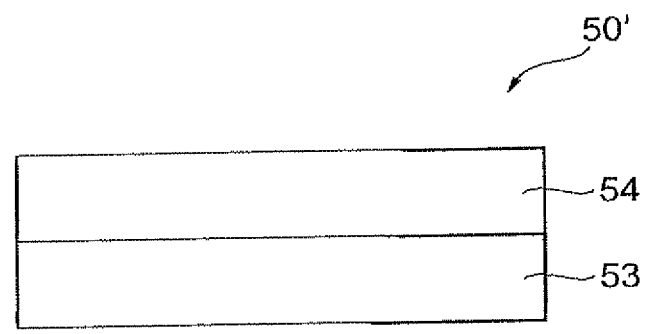
FIG. 8 is a diagram illustrating the structure of an intermediate layer before heating.

FIG. 8 is a diagram illustrating the longitudinal sectional structure of the intermediate layer 50' before heating.

In Example 10, the plating formation steps (G2) and (G3) are performed successively. As illustrated in FIG. 8, therefore, the palladium plating layer 53 and the gold plating layer 54 are formed on the wiring conductor successively, and by the heating in (H) Solder region Formation Process, palladium and gold, which have high diffusion coefficients, diffuse into the solder balls. Since copper, which forms the wiring conductor, also has a high diffusion coefficient, it diffuses into the solder balls. The intermediate layer 50 therefore includes an intermetallic compound having tin and copper as primary components. The region of the under layer being in contact with the intermediate layer 50' in the wiring conductor becomes the conductor region 40, and the conductor region 40 includes copper.

In Example 11, an electronic device for evaluation was obtained as in Example 1 except that the electroless nickel plating bath was changed to one indicated as "b" in Table 1 in (G1) Electroless Nickel Plating Step. The phosphorous concentration was 5% by mass as a result of measurement of the phosphorous concentration within the electroless nickel plating film under an EDS. This was designated as the electronic device of Example 11.

The structure of the intermediate layer 50' of Example 11 is, as illustrated in FIG. 6, the same as Example 1.

Example 12

In Example 12, the following steps out of the steps in Example 1 and the step (G4) were performed in the following order.
(A) Substrate Preparation Step
(B) Degreasing Step
(C) Soft Etching Step
(G4) Electroless Tin Plating Step
(G1) Electroless Nickel Plating Step
(G3) Electroless Gold Plating Step
(H) Solder region Formation Step
(I) Component Mounting Step
(J) Production of Board for Evaluation
(K) Solder Applying Step
(L) Module Board Mounting Step
(M) Solder Reflow Step In Example 12, first, (A) Substrate Preparation Step, (B) Degreasing Step, and (C) Soft Etching Step were performed as in Example 1. In Example 12, the steps (D), (E), and (F) in Example 1 were omitted, and (G4) Electroless Tin Plating Step was added in place thereof. The step is as follows.
(G4) Electroless Tin Plating Step A tin (Sn) plating film with a thickness of 0.2 μm was formed on the solder ball connection terminals. An electroless tin plating solution having a composition indicated in Table 4 (temperature: 30° C., pH: 1.5) was prepared. The solder ball connection terminals (the conductor) that have been subjected to etching treatment obtained as described above were immersed into the electroless tin plating solution in Table 4 for 30 minutes to form a tin plating film. After the tin plating treatment, the conductor was washed with water to obtain a conductor formed with the tin plating film.

After the step (G4), by the method as in Example 1, (G1) Electroless Nickel Plating Step was performed to form a nickel plating film on the tin plating film, and then (G3) Electroless Gold Plating Step was performed to form a gold plating film on the nickel plating film. Furthermore, (H) Solder region Formation Step, (I) Component Mounting Step, (J) Production of Board for Evaluation, (K) Solder Applying Step, (L) Module Board Mounting Step, and (M) Solder Reflow Step were performed to obtain an electronic device for evaluation. This was designated as the electronic device of Example 12. In Example 12, (G2) Electroless palladium Plating Step is omitted. In (G1) Electroless Nickel Plating Step, the film thickness of the nickel plating film was 0.1 μm, and in (G3) Electroless Gold Plating Step, the thickness was 0.05 μm. The steps in Example 12 other than these are the same as Example 1.

Figure 9:
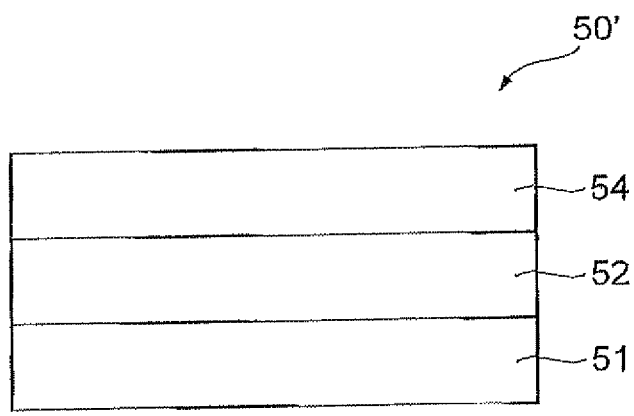
FIG. 9 is a diagram illustrating the structure of an intermediate layer before heating.

FIG. 9 is a diagram illustrating the longitudinal sectional structure of the intermediate layer 50' before heating.

In Example 12, the plating formation steps (G4), (G1), and (G3) are performed successively. As illustrated in FIG. 9, therefore, the intermediate layer 50' in which a tin plating layer 51, the nickel plating layer 52, and the gold plating layer 54 are formed on the wiring conductor successively is formed, but by the heating in (H) Solder region Formation Step, nickel perfectly diffuses into the solder balls and the tin plating layer, and the nickel plating layer 52 vanishes, since the thickness of the nickel plating layer 52 is small. The region of the under layer being in contact with the tin plating layer in the wiring conductor becomes the conductor region. The intermediate layer 50 after heating therefore includes an intermetallic compound having tin, copper, and nickel as primary components, and the conductor region 40 includes copper.

Example 13

Example 13 is different from Example 12 in performing the electroless palladium plating Step as in the step (G2) in Example 1, in place of (G1) Electroless Nickel Plating Step in Example 12. In (G2) Electroless Palladium Plating Step in Example 13, "B" in Table 2 was used as the electroless palladium plating solution, and the thickness of the palladium plating film was 0.1 μm. In (G3) Electroless Gold Plating Step, the film thickness of the gold plating film was 0.05 μm.

The steps other than these were the same as Example 12. An electronic device was thus produced, and this was designated as the electronic device of Example 13. In Example 13, the palladium plating film is formed on the tin plating film, and the gold plating film is formed thereon.

Figure 10:
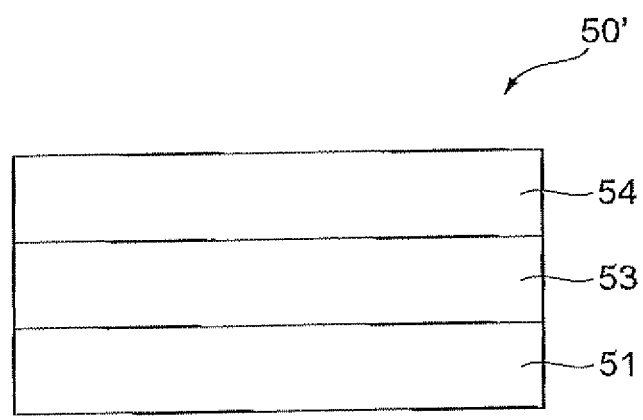
FIG. 10 is a diagram illustrating the structure of an intermediate layer before heating.

FIG. 10 is a diagram illustrating the longitudinal sectional structure of the intermediate layer 50' before heating.

In Example 13, the plating formation steps (G4), (G2), and (G3) are performed successively. As illustrated in FIG. 10, therefore, the tin plating layer 51, the palladium plating layer 53 and the gold plating layer 54 are formed on the wiring conductor successively, and by the heating in (H) Solder region Formation Step, palladium and gold, which have high diffusion coefficients, diffuse into the solder balls and the tin plating layer 51. Furthermore, since copper, which is contained in the conductor region 40 arranged under and being in contact with the tin plating layer 51, also has a high diffusion coefficient, it diffuses into the solder. The intermediate layer 50 therefore includes an intermetallic compound having tin and copper as principal components, and the conductor region 40 includes copper.

Example 14

Example 14 is different from Example 12 in performing the step (G2) between the step (G1) and the step (G3) in Example 12. In Example 14, the thickness of the nickel plating film was 3.0 μm in (G1) Electroless Nickel Plating Step, "B" in Table 2 was used as the electroless palladium plating solution, and the thickness of the palladium plating film was 0.1 μm in (G2) Electroless Palladium Plating Step, and the thickness of the gold plating was 0.05 μm in (G3) Electroless Gold Plating Step. The steps other than these were the same as Example 12. An electronic device was thus produced, and this was designated as the electronic device of Example 14. In Example 14, the nickel plating film is formed on the tin plating film, and the gold plating film is formed on the palladium plating film.

Figure 11:
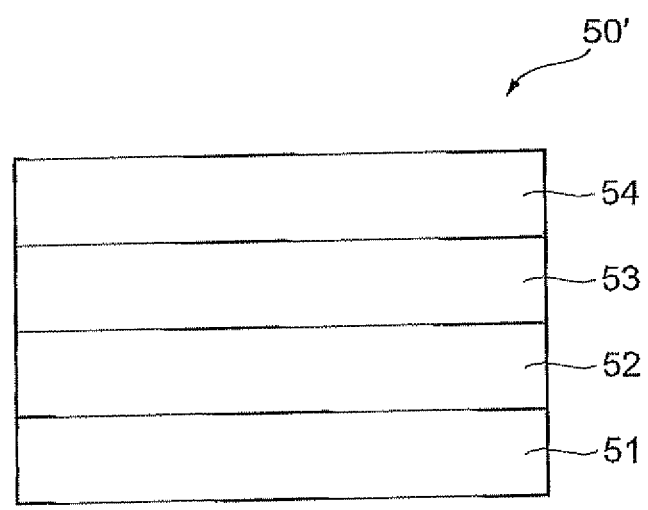
FIG. 11 is a diagram illustrating the structure of an intermediate layer before heating.

FIG. 11 is a diagram illustrating the longitudinal sectional structure of the intermediate layer 50' before heating.

In Example 14, the plating formation steps (G4), (G1), (G2), and (G3) are performed successively. As illustrated in FIG. 11, therefore, the tin plating layer 51, the nickel plating layer 52, the palladium plating layer 53, and a gold plating layer 54 are formed on the base conductor successively, and by the heating in (H) Solder region Formation Step and following diffusion, the intermediate layer 50 includes an intermetallic compound having tin, copper, and nickel as principal components, and the conductor region 40 becomes a nickel-phosphorous alloy as in Example 1.

As described above, in Example 1 to Example 14, the terminal structure includes solder-joint conductor region (40) placed on the wiring conductor (30), the intermediate layer (50) contacting with the conductor region (40), and the solder region (70) contacting with the intermediate layer (50). The intermediate layer (50) includes an intermetallic compound having tin and at least one of copper and nickel as principal components. The conductor region 40 may contain nickel or a nickel-based alloy.

When the indentation modulus of the conductor region (40) is E1, and the indentation modulus of the intermediate layer (50) is E2, E1 and E2 satisfy the expression (1): $0.8 \leq E1/E2 \leq 1.5$. When the indentation modulus of the solder region 70 is E3, E3 is smaller than E2.

Comparative Example 1

An electronic device for evaluation was obtained as in Example 6 except that the solder melting time was 90 seconds in (H) Solder region Formation Step. This was designated as the electronic device of Comparative Example 1.

Comparative Example 2

An electronic device for evaluation was obtained as in Example 8 except that the solder melting time was 50 seconds and the top temperature was 260° C. in (H) Solder region Formation Step. This was designated as the electronic device of Comparative Example 2.

Comparative Example 3

An electronic device for evaluation was obtained as in Example 11 except that the electroless nickel plating bath indicated as b in Table 1 was used and that the solder melting time was 50 seconds and the top temperature was 260° C. in (H) Solder region Formation Step. This was designated as the electronic device of Comparative Example 3.

TABLE 1

| Bath type | a | b |
|---|---|---|
| Electroless nickel plating bath | | |
| pH | 4.6 | 5.1 |
| Temperature [° C.] | 85 | 80 |
| Bath composition (g/L) | | |
| Nickel sulfate hexahydrate | 22.5 | 19.5 |
| Sodium hypophosphite | 20 | 20 |
| Malic acid | 10 | 10 |
| Succinic acid | 10 | 10 |

The electroless nickel plating solution includes nickel sulfate hexahydrate, sodium hypophosphite, malic acid, and succinic acid.

TABLE 2

| Bath type | A | B |
|---|---|---|
| Electroless palladium plating bath | | |
| pH | 6 | 6 |
| Temperature [° C.] | 60 | 60 |
| Bath composition (g/L) | | |
| Dichloro(ethylenediamine)palladium solution* | 2 | 2 |
| Ethylenediamine | 10 | 10 |
| Sodium formate | 10 | |
| Sodium hypophosphite | | 12 |

*2 g/L as palladium

The electroless palladium plating solution includes dichloro(ethylenediamine)palladium solution, ethylenediamine, and sodium formate in the plating solution "A." In the plating solution "B," it includes dichloro(ethylenediamine)palladium solution, ethylenediamine, and sodium hypophosphite.

TABLE 3

| Electroless gold plating bath | |
|---|---|
| pH | 7 |
| Temperature [° C.] | 80 |
| Bath composition (g/L) | |
| Flash Gold 330A* | 150 mL/L |
| Potassium gold cyanide** | 1.8 g/L |

*Manufactured by Okuno Chemical Industries Co., Ltd., product name
**1.8 g/L as gold The electroless gold plating solution includes Flash Gold 330A (manufactured by Okuno Chemical Industries Co., Ltd. (product name)) and potassium gold cyanide.

TABLE 4

| Name of component | Content |
|---|---|
| Tin methanesulfonate | 30 g/L |
| Methanesulfonic acid | 100 g/L |
| Thiourea | 70 g/L |

This electroless tin plating solution includes tin methanesulfonate, methanesulfonic acid, thiourea, and additives.

Evaluation of Terminal Structure

A cross section of the electronic device having the terminal structure produced by the above-described method was mirror polished, and the constitutive elements of the conductor region and the principal component elements of the intermediate layer that constitute the terminal structure were examined under an EDS. The results are shown in Table 5.

TABLE 5

| | Conductor region | | Intermediate layer | | Solder region | | Drop test | |
|---|---|---|---|---|---|---|---|---|
| | Constitutive component | E1 [GPa] | Principal component elements | E2 [GPa] | E3 [GPa] | E1/E2 | Number | Evaluation |
| Example 1 | Nickel-phosphorous alloy | 131 | Nickel, copper, tin | 104 | 55.2 | 1.3 | 194 | S |
| Example 2 | Nickel-phosphorous alloy | 145 | Nickel, copper, tin | 116 | 50.0 | 1.2 | 168 | S |
| Example 3 | Nickel-phosphorous alloy | 138 | Nickel, copper, tin | 111 | 50.7 | 1.2 | 124 | S |
| Example 4 | Nickel-phosphorous alloy | 171 | Nickel, copper, tin | 116 | 48.5 | 1.5 | 91 | A |
| Example 5 | Copper | 105 | Nickel, copper, tin | 103 | 47.5 | 1.0 | 143 | S |
| Example 6 | Copper | 113 | Copper, tin | 99 | 46.1 | 1.1 | 128 | S |
| Example 7 | Copper | 110 | Copper, tin | 107 | 49.9 | 1.0 | 112 | S |
| Example 8 | Copper | 84.3 | Copper, tin | 98.7 | 52.5 | 0.9 | 97 | A |
| Example 9 | Copper | 88.5 | Copper, tin | 107 | 49.7 | 0.8 | 64 | A |
| Example 10 | Copper | 109 | Copper, tin | 100 | 52.8 | 1.1 | 104 | S |
| Example 11 | Nickel-phosphorous alloy | 148 | Nickel, copper, tin | 109 | 53.5 | 1.4 | 62 | A |
| Example 12 | Copper | 106 | Nickel, copper, tin | 101 | 48.7 | 1.0 | 132 | S |
| Example 13 | Copper | 110 | Copper, tin | 104 | 51.8 | 1.1 | 108 | S |
| Example 14 | Nickel-phosphorous alloy | 138 | Nickel, copper, tin | 114 | 52.3 | 1.2 | 118 | S |
| Comparative Example 1 | Copper | 108 | Copper, tin | 145 | 50.9 | 0.7 | 11 | B |
| Comparative Example 2 | Copper | 88.3 | Copper, tin | 147 | 54.0 | 0.6 | 4 | B |
| Comparative Example 3 | Nickel-phosphorous alloy | 180 | Nickel, copper, tin | 115 | 50.0 | 1.6 | 33 | B |

Measurement of Indentation Modulus

Using an ultra-micro indentation hardness tester made by ELIONIX INC. (the product name: ENT-1100a), the indentation modulus was measured from the relationship between indentation displacement and load in each layer of each example and comparative example. The results are shown in Table 4. By setting $F_{max}$, $F_{min}$, t1, t2, and t3 in the measurement of indentation modulus to be the followings, the measurement was performed so that an indenter during an indentation test would not enter an adjacent layer.

$F_{max}$=2.5 mN, $F_{min}$=0.05 mN t1=5 seconds, t2=2 seconds, t3=5 seconds

Evaluation of Drop Strength

Using a drop test apparatus, a drop test for the electronic device of each example and comparative example was performed. Specifically, a drop impact (drop acceleration: 14700 m/s$^2$) was repeatedly applied to the connection surface between the module board and the motherboard, and resistance between the terminal of the module board and the electrode terminal of the motherboard was measured for each drop. The drop test was performed using six electronic devices produced similarly in each example and comparative example, and the average value of the number of drops until the resistance becomes 100 times as large as the initial resistance or more was determined. As the number of drops becomes larger, the drop strength is more favorable. One having an average value of the six of 100 or more was evaluated as "S," one having the value of not less than 60 and less than 100 "A," and one having the value of less than 60 "B." The results are shown in Table 4.

As shown in Table 5, Examples 1 to 14 gave favorable evaluation results in the drop test. As a result, it has proved that in Example 1 to 14, terminal structures that can achieve sufficiently excellent drop strength, even when a drop impact was applied, were obtained.

As described above, the terminal structure, printed circuit board, module board, electronic device, and method for manufacturing a terminal structure above are useful for electronic devices that need durability against drop impact.

What is claimed is:

1. A terminal structure comprising:
   a solder joint conductor region placed on a wiring conductor;
   an intermediate layer contacting with the conductor region; and
   a solder region contacting with the intermediate layer,
   wherein the intermediate layer comprises an intermetallic compound including tin and at least one of copper and nickel as principal components; and
   wherein E1 and E2 satisfy the following expression (1):

$$0.8 \leq E1/E2 \leq 1.5 \qquad (1),$$

where an indentation elastic modulus of the conductor region is E1 and an indentation elastic modulus of the intermediate layer is E2.

2. The terminal structure according to claim 1, wherein the conductor region is copper or a copper-based alloy.

3. The terminal structure according to claim 1, wherein the conductor region is nickel or a nickel-based alloy.

4. The terminal structure according to claim 1, wherein when an indentation elastic modulus of the solder area is E3, E3 is smaller than E2.

5. The terminal structure according to claim 2, wherein when an indentation elastic modulus of the solder area is E3, E3 is smaller than E2.

6. The terminal structure according to claim 3, wherein when an indentation elastic modulus of the solder area is E3, E3 is smaller than E2.

7. A printed circuit board comprising the terminal structure according to claim 1.

8. A module board comprising the printed circuit board according to claim 7.

9. An electronic device comprising the module board according to claim 8.

10. A method for manufacturing a terminal structure, the method comprising:
- a step of preparing a terminal structure including a solder joint conductor region placed on a wiring conductor, an intermediate layer contacting with the conductor region, and a solder region contacting with the intermediate layer;
- a step of measuring the indentation elastic modulus of the conductor region;
- a step of measuring the indentation elastic modulus of the intermediate layer;
- a step of judging whether resistance to drop impact of the terminal structure is favorable based on a value of the indentation elastic modulus of the conductor region and a value of the indentation elastic modulus of the intermediate layer; and
- a step of producing a terminal structure under the same condition as a production condition of the terminal structure that has been judged to show favorable resistance to drop impact at the step of judging.

11. The method for manufacturing a terminal structure according to claim 10, wherein the intermediate layer comprises an intermetallic compound including tin and at least one of copper and nickel as principal components.

* * * * *